(12) United States Patent
Crandell

(10) Patent No.: US 11,990,884 B2
(45) Date of Patent: *May 21, 2024

(54) VARIABLE CAPACITOR BANK

(71) Applicant: AES Global Holdings, Pte. Ltd., Singapore (SG)

(72) Inventor: Courtney L. Crandell, Fort Collins, CO (US)

(73) Assignee: AES Global Holdings, Pte. Ltd., Singapore (SG)

( * ) Notice: Subject to any disclaimer, the term of this patent is extended or adjusted under 35 U.S.C. 154(b) by 458 days.

This patent is subject to a terminal disclaimer.

(21) Appl. No.: 17/271,375

(22) PCT Filed: Sep. 4, 2019

(86) PCT No.: PCT/US2019/049554
§ 371 (c)(1),
(2) Date: Feb. 25, 2021

(87) PCT Pub. No.: WO2020/101792
PCT Pub. Date: May 22, 2020

(65) Prior Publication Data
US 2021/0313969 A1 Oct. 7, 2021

Related U.S. Application Data

(63) Continuation of application No. 16/126,955, filed on Sep. 10, 2018, now Pat. No. 10,622,972.

(51) Int. Cl.
*H03H 19/00* (2006.01)
*H01L 29/868* (2006.01)
(Continued)

(52) U.S. Cl.
CPC .......... *H03H 19/004* (2013.01); *H01L 29/868* (2013.01); *H03H 7/40* (2013.01);
(Continued)

(58) Field of Classification Search
CPC .......... H03H 19/004; H03H 7/40; H03H 5/12; H03H 7/38; H01L 29/868; H01L 23/5223; H01J 37/32183; H01J 37/32174
See application file for complete search history.

(56) References Cited

U.S. PATENT DOCUMENTS 5,670,881 A 9/1997 Arakawa
7,132,040 B2 11/2006 Yamagishi et al.
(Continued)

FOREIGN PATENT DOCUMENTS

CN 201828656 5/2011
CN 2018828656 U 5/2012
(Continued)

OTHER PUBLICATIONS

Poos, John W., "Office Action Regarding U.S. Appl. No. 16/126,955", dated Mar. 22, 2019, p. 9, Published in: US.
(Continued)

*Primary Examiner* — John W Poos
(74) *Attorney, Agent, or Firm* — Neugeboren O'Dowd PC

(57) ABSTRACT

A variable capacitor bank includes a conductive housing and a port extending through the housing. An electrical bus is disposed within the conductive housing and coupled to the port. The variable capacitor bank further includes capacitor modules disposed within the housing. Each capacitor module includes a module input electrically coupled to the electrical bus and a switched capacitor branch electrically coupled to the module input, the switched capacitor branch including a capacitor and a switch element in series with the capacitor. In certain implementations, one or more of the capacitor modules may include at least one second switched capacitor branch. The capacitor modules may further include an unswitched, or "floor", capacitor that provides a minimum or otherwise known capacitance of the capacitor (Continued)

module. Each capacitor module may further be grounded by being electrically coupled to the conductive housing.

20 Claims, 12 Drawing Sheets

(51) Int. Cl.
*H03H 7/40* (2006.01)
*H01G 4/40* (2006.01)
*H01J 37/32* (2006.01)
*H01L 23/522* (2006.01)

(52) U.S. Cl.
CPC .......... *H01G 4/40* (2013.01); *H01J 37/32183* (2013.01); *H01L 23/5223* (2013.01)

(56) References Cited

U.S. PATENT DOCUMENTS

| | | | |
|---|---|---|---|
| 8,457,760 B2 * | 6/2013 | Johnson | H03H 7/0107 607/63 |
| 8,509,913 B2 * | 8/2013 | Johnson | A61B 5/7203 607/63 |
| 10,622,972 B2 | 4/2020 | Crandell | |
| 2004/0041671 A1 | 3/2004 | Van Rumpt | |
| 2004/0163594 A1 | 8/2004 | Windhorn | |
| 2005/0024813 A1 | 2/2005 | Shimizu | |
| 2005/0098116 A1 | 5/2005 | Yamagishi | |
| 2013/0201067 A1 | 8/2013 | Hu et al. | |
| 2013/0207738 A1 | 8/2013 | Mason | |
| 2013/0223040 A1 | 8/2013 | Li | |
| 2015/0349750 A1 | 12/2015 | Van Zyl et al. | |
| 2016/0315373 A1 | 10/2016 | Azad et al. | |
| 2017/0178865 A1 * | 6/2017 | Ulrich | H01J 37/32183 |

FOREIGN PATENT DOCUMENTS

| | | |
|---|---|---|
| JP | 57-138323 U1 | 2/1982 |
| JP | 9308618 | 12/1997 |
| JP | 2002329639 | 11/2002 |
| JP | 2002329639 A | 11/2002 |
| JP | 2005-50962 A | 2/2005 |
| JP | 200550962 | 2/2005 |
| JP | 2014505983 | 3/2014 |
| JP | 2014505983 A | 3/2014 |
| WO | 2005024813 | 3/2005 |
| WO | 2012099774 | 7/2012 |
| WO | 2012099774 A | 7/2012 |

OTHER PUBLICATIONS

Poos, John W., "Office Action Regarding U.S. Appl. No. 16/126,955", dated Aug. 13, 2019, p. 10, Published in: US.

Dekoninck, Sabine, "International Search Report and Written Opinion Regarding International Application No. PCT/US2019/049554", dated Jun. 3, 2020, p. 15, Published in: EP.

Taiwanese References of Citations in Search Report of Taiwanese Patent Application No. 108132231, dated Mar. 21, 2023.

Shu Xiongwen, Chinese Office Action, National Intellectual Property Administration of The People's Republic of China, Sep. 6, 2023, China.

Shunpei Suzaki, Japanese Office Action, Notice Of Reasons For Rejection, Sep. 1, 2023.

Suzaki, Shunpei, Office Action issued in Japanese Patent Application No. 2021-512925, Sep. 1, 2023, p. 10.

CNIPA, Office Action issued in Chinese Patent Application No. 201980059067.3, Sep. 6, 2023, p. 18.

EPO, Extended European search report issued in Application No. 23202393.7, Jan. 10, 2024, 13 pages.

* cited by examiner

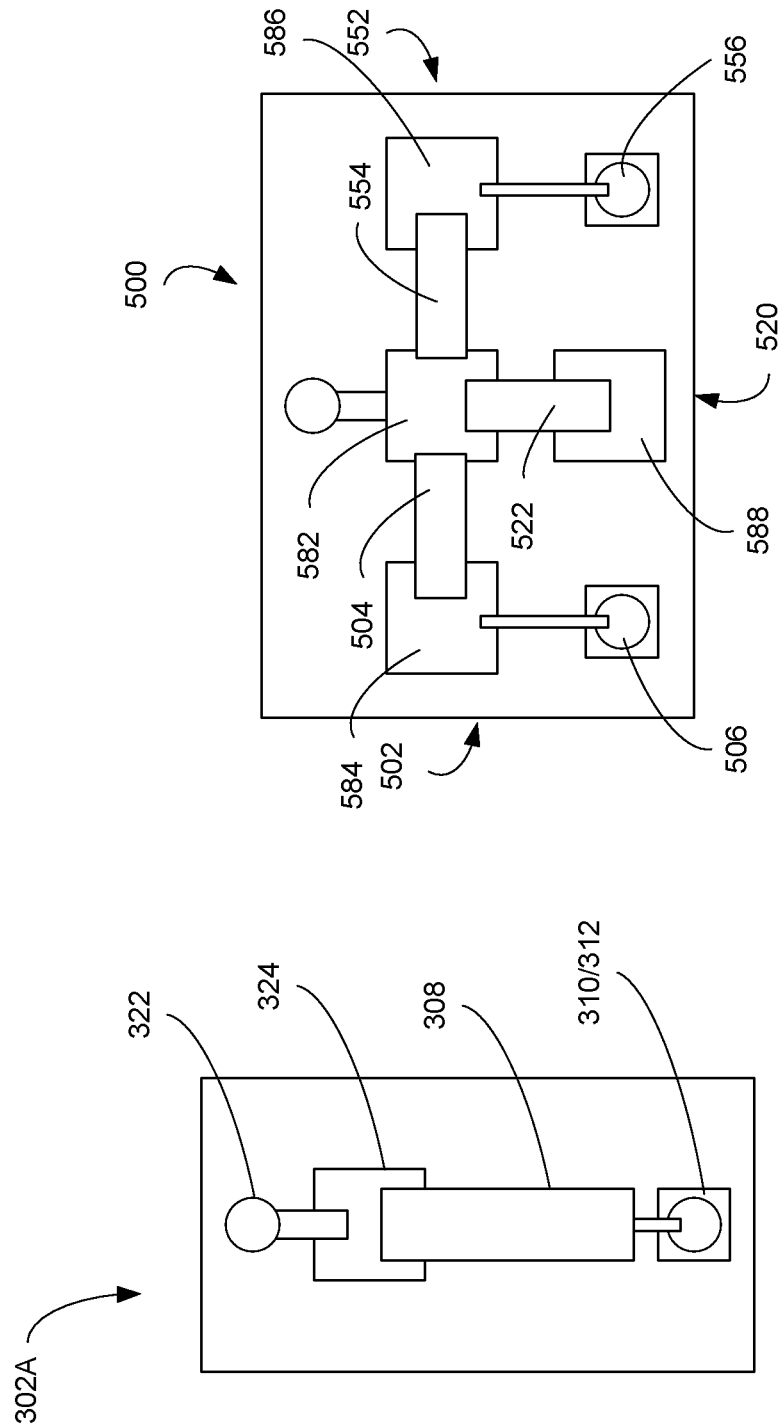

VARIABLE CAPACITOR BANK

CROSS-REFERENCE TO RELATED APPLICATION

This Patent Cooperation Treaty (PCT) patent application claims priority to U.S. Nonprovisional application Ser. No. 16/126,955 entitled "Variable Capacitor Bank", filed on Sep. 10, 2018, the entire contents of which is incorporated herein by reference for all purposes.

TECHNICAL FIELD

Aspects of the present disclosure relate to variable capacitor banks and, in particular, to variable capacitor banks for use in impedance matching systems.

BACKGROUND

In the field of semiconductor manufacturing, as well as other fields, a plasma chamber has various possible uses. For example, plasma-enhanced chemical vapor deposition (CVD) is a process used to deposit thin films on a substrate using a plasma chamber. In high level terms, a radio frequency (RF) power supply is coupled to the plasma chamber to supply power to ignite and sustain a plasma from reacting gases, within the chamber, and from which the deposition occurs on a substrate within the chamber. In order to achieve efficient and accurate power transfer between the RF supply and the plasma load, an impedance-matching network is often used to match the load impedance (including the impedance of the plasma) to the output impedance of the power supply.

The source impedance of the RF power supply may vary by application; however, the industry standard is to have a source impedance of 50 Ohms for most RF generators. Load impedance, on the other hand, may vary widely based on a range of variables including, without limitation, generator frequency, power, chamber pressure, gas composition, plasma ignition, and other variations in the plasma load during processing. As a result, in most applications, the matching network is used to adjust the load impedance such that it remains as close as possible to the source impedance (e.g., 50 Ohms in most, but not all, cases). The match network accounts for these variations in load impedance by varying electrical elements to match the varying load impedance to the generator's output impedance.

Match networks typically contain reactive elements, meaning elements that store energy in electrical and magnetic fields as opposed to resistive elements that dissipate electrical power. The most common reactive elements are capacitors, inductors and coupled inductors but others such as distributed circuits are also used. Match networks can also include lossless elements including transmission lines and transformers. The only resistive elements in a match network are typically associated with losses in non-ideal reactive and lossless components or components that do not take part in the impedance transformation such as components for sensing voltage, current, power or temperature.

Match networks can include a number of variable reactive elements. For instance, vacuum variable capacitors can be used. However, these are bulky and expensive. In the alternative, banks of parallel capacitors having different capacitances, and being added or removed from the parallel circuit via electrical switches are also typical. Often, such capacitor banks use high power PIN diodes (controlled by a transistor) to switch the capacitors in and out of the parallel system.

Accurate impedance matching using a match network generally requires a thorough understanding of the characteristics of the reactive elements within the match network. For example, such characteristics may include changes in the reactance of a variable capacitor when in different switched states. During operation, however, interactions between the electromagnetic fields of the various reactive elements within a given match network can lead to unpredictable and highly variable changes in the characteristics of the reactive elements.

It is with these observations in mind, among others, that aspects of the present disclosure were conceived.

SUMMARY

In one aspect of the present disclosure, a variable capacitor bank is provided. The variable capacitor bank includes a conductive housing and a port extending through the housing. An electrical bus is disposed within the conductive housing and coupled to the port. The variable capacitor bank further includes capacitor modules disposed within the housing. Each capacitor module includes a module input electrically coupled to the electrical bus and a switched capacitor branch electrically coupled to the module input, the switched capacitor branch including a capacitor and a switch element in series with the capacitor. In certain implementations, one or more of the capacitor modules may include at least one second switched capacitor branch. The capacitor modules may further include an unswitched, or "floor", capacitor that provides a minimum or otherwise known capacitance of the capacitor module. Each capacitor module may further be grounded by being electrically coupled to the conductive housing.

In such implementations, the variable capacitor bank may have a single port by which the controllable reactive elements within the module are coupled to exterior circuit elements such as those of a match network. In addition to the shielding provided by the conductive housing, such single port arrangements further isolate variable capacitor banks of the present disclosure from interactions with other elements of circuits within which they are disposed, thereby improving the accuracy with which the variable capacitor banks may be characterized. Nevertheless, in alternative implementations, the variable capacitor bank may be configured in a two-port arrangement with improved characterization resulting from the conductive housing.

In another aspect of the present disclosure, a variable capacitor bank is provided that includes a conductive housing, a port extending through the housing, and an electrical bus disposed within the conductive housing and coupled to the port. The variable capacitor bank further includes multiple capacitor modules disposed within the housing and coupled to each of the electrical bus and the conductive housing, each of the capacitor modules including a switched capacitor branch. A respective conductive path is defined between the port and the conductive housing through each of capacitor modules such that each of the respective conductive paths has a substantially equal length.

In yet another aspect of the present disclosure, an impedance matching module is provided that includes a variable capacitor bank. The variable capacitor bank further includes a conductive housing, a port extending through the housing, and an electrical bus disposed within the conductive housing and coupled to the port. Capacitor modules are disposed within the housing and coupled to each of the electrical bus and the conductive housing. Each capacitor module includes a module input and a switched capacitor branch coupled to the module input and the conductive housing, the switched capacitor branch including a capacitor and a switch element in series with the capacitor.

BRIEF DESCRIPTION OF THE DRAWINGS

The various features and advantages of the technology of the present disclosure will be apparent from the following description of particular embodiments of those technologies, as illustrated in the accompanying drawings. It should be noted that the drawings are not necessarily to scale; however the emphasis instead is being placed on illustrating the principles of the technological concepts. Also, in the drawings the like reference characters may refer to the same components throughout the different views. The drawings depict only typical embodiments of the present disclosure and, therefore, are not to be considered limiting in scope.

FIG. 6 is a schematic illustration of the capacitor module of FIG. 4.

FIG. 7 is a schematic illustration of the capacitor module of FIG. 5.

DETAILED DESCRIPTION

Figure 1:
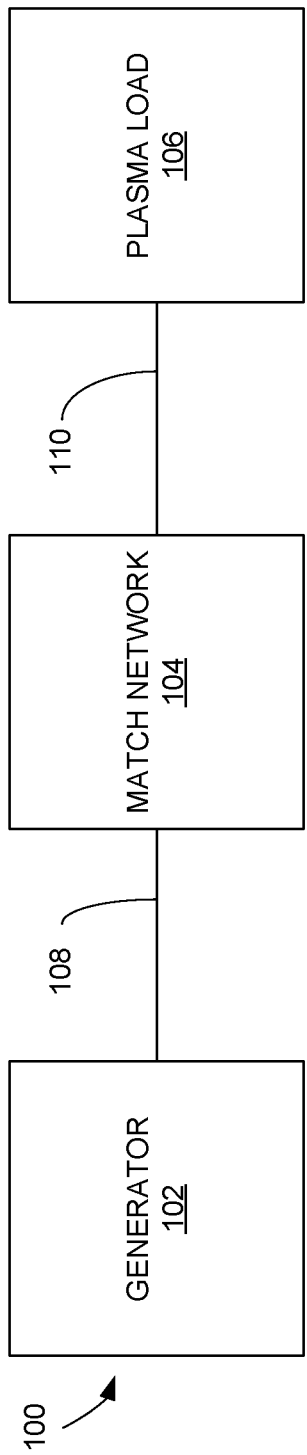
FIG. 1 is a block diagram of a plasma processing system including a match network.

Embodiments of the present disclosure provide a variable capacitor bank that may be used, for example, in an impedance matching system for a plasma chamber. The variable capacitor bank includes a grounded housing within which multiple capacitor modules are disposed. The capacitor modules share a bus and each includes one or more switched capacitors such that by selectively switching the capacitors, the variable capacitor module can provide a range of capacitances. The housing of the variable capacitor bank is formed of a conductive material such that the various components contained therein are shielded from potential interactions caused by adjacent reactive elements, such as inductors or other capacitors. In certain implementations, each of the capacitor modules is electrically coupled to the housing such that the housing provides a ground for the capacitor modules.

In various implementations, the variable capacitor bank may have a single-port configuration that, in combination with the shielding effects of the housing, significantly improve the ability to accurately and reliably characterize the variable capacitor bank. Stated differently, variable capacitor elements may be housed within a common housing, and a connection to those variable capacitor elements may be provided by way of a single port in the housing. The single port may include, at least in part, a connection to a single conductive element or feature, which may be referred to as a bus, where the variable capacitive elements are each coupled with the conductive feature and operatively coupled with external circuit elements by way of the port. In general, characterization of the variable capacitor banks disclosed herein is enhanced by improved isolation from other elements included in circuits within which the variable capacitor bank may be included. For example, the conductive housing shields the capacitors of the variable capacitor bank from parasitic effects which would otherwise be induced by electromagnetic fields produced by adjacent reactive components and which would otherwise introduce significant variability into the performance of the capacitor bank.

Matching circuits used in radio frequency (RF) applications may include at least one variable capacitor element for dynamically adjusting the impedance provided by the matching circuit. Often, such elements are disposed within a module or similar housing with other reactive elements and, as a result, are often influenced by the various electromagnetic fields produced by the other reactive elements of the matching circuit during operation. Such interactions are complex and highly variable and often preclude or significantly challenge accurate characterization of the matching circuit and its components, including any variable capacitor elements that may be included in the matching circuit. Moreover, to the extent characterization of conventional variable capacitors is possible, it typically requires such variable capacitors to include multiple ports to perform the required analysis, which is impractical.

While an entire match network can be measured using a two-port configuration, isolating the effect of changing each element to adjust the tuning to have the desired range and efficiency typically requires that each component reacts sufficiently independently from the others. Conventional match network designs are generally insufficient in isolating individual components, such as variable capacitors, from the other elements and, as a result, there is no clear "port" that enables independent measurement and characterization of certain components within the match network. For example, the performance and characteristics of a variable capacitor of a conventional match network that is open or unshielded from surrounding reactive elements is impacted each time a different capacitor of the match network is switched into or out of the match circuit. Accordingly, the characteristics, such as overall impedance, of the variable capacitor may be significantly impacted depending on the state of the other capacitors. Moreover, even if a physical port could be defined for each switched capacitor within variable capacitors of conventional match networks, the number of measurement setups would approach 2^n (where "n" is the number of switchable capacitors) in order to fully and accurately characterize the variable capacitor. To achieve a practical resolution, greater than 30 switched capacitors are often required, and, as a result, such characterization methods are prohibitively complex and costly. Ultimately, meaningful characterization of variable capacitors is difficult to achieve and engineers and designers of matching circuits are often left to rely on their experience to identify workable, but usually suboptimal, solutions for particular applications.

To address the foregoing issues, variable capacitor banks in accordance with the present disclosure include an array of switched capacitors enclosed in a grounded enclosure. In certain implementations, the variable capacitor bank is also configured to include a single port extending outside of the enclosure for coupling the variable capacitor bank to other elements of a matching or other circuit. In combination, these features significantly reduce the influence of other elements of the matching circuit on the variable capacitor, enabling accurate characterization of the variable capacitor in each of its states.

The switched capacitors of the variable capacitor may, in certain implementations, be arranged in an array of capacitor modules coupled to each of a shared electrical bus and the enclosure. Each capacitor module may include one or more switched capacitors in parallel that may be selectively switched/presented into or out of the parallel connection with other switched capacitors to vary the capacitance of the capacitor module and, as a result, the total capacitance of the variable capacitor. In certain implementations, each capacitor module may also include one or more unswitched capacitor branches that provide a minimum or "floor" capacitance of the capacitor module.

In relatively low frequency operations, the distribution of the capacitor modules within the enclosure is relatively unimportant because parasitic losses are relatively low. Accordingly, the capacitor modules may be distributed within the housing at varying distances from the port. However, as frequency is increased, differences in the distances between the port and the capacitor modules results in significantly greater variations in impedance. To reduce such variations, certain implementations of the present disclosure include circular or similar arrangements in which each capacitor module is substantially equidistant from the port of the variable capacitor. Regardless of whether an equidistant arrangement is implemented, the distance to ground through each capacitor module may also be minimized to limit inductance to ground.

While the present disclosure is focused primarily on plasma systems and, more specifically, match networks for use in plasma systems, the variable capacitor banks of the present disclosure are not limited to such applications. For example and without limitation, variable capacitor banks in accordance with the present disclosure may also be implemented in tuning or similar circuits in addition to impedance matching applications.

FIG. 1 is a block diagram 100 of a plasma processing system according to one embodiment of this invention. A generator 102 transmits RF power to a match network 104 via a transmission line 108 (e.g., coaxial cable) and then onto a plasma load 106 via an electrical connection 110. The match network 104 varies its internal electrical elements to match the input impedance to the plasma load and account for changes to that input impedance brought on by variations from the load among other things. In general, the load is monitored to identify such changes and control signals to match network cause changes to the elements (e.g., the switched capacitors) to alter the impedance from the match network.

Figure 2:
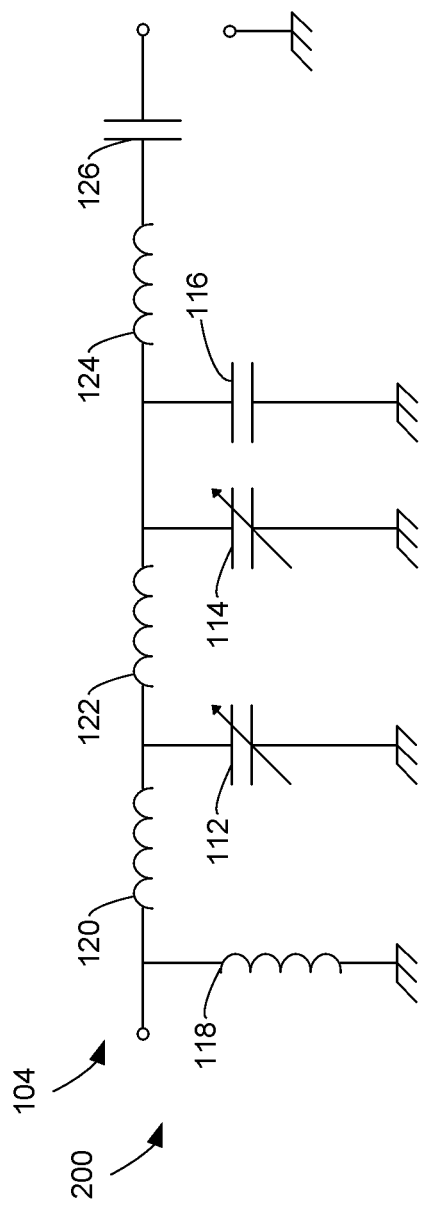
FIG. 2 is a circuit diagram of the match network of FIG. 1.

FIG. 2 is a circuit diagram 200 illustrating one possible representative arrangement of components of the match network 104. Although other configurations of the match network 104 are possible, the match network 104 of FIG. 2 includes two variable capacitance elements 112, 114, a fixed capacitance element 116, and an inductor 118 coupled in parallel. The match network 104 further includes multiple series inductors 120-124 and a series capacitor 126. Impedance of the match network is controlled by altering one or both of the capacitances of the variable capacitance elements.

The match network 104 of FIG. 2 is intended to illustrate one example of a match network in accordance with the present disclosure. More generally, match networks in accordance with the present disclosure include at least one variable capacitance element. Generally speaking, the variable capacitors may be electrically or mechanically variable. The variable capacitance element may be connected in parallel or in series, as described below in more detail. The type and quantity of the remaining components of the match network may be varied according to specific application requirements. For example, the quantity and values of the other inductors and capacitors may be varied according to the particular application. Also, each of the other inductors and capacitors of the match network may be either variable or fixed.

As previously noted, the match network 104 may include one or more variable capacitance elements, such as variable capacitance elements 112, 114. The following discussion describes the variable capacitance element 112 in detail, however, it should be understood that the various features of the variable capacitance element 112 may also be included in the variable capacitance element 114 or any other variable capacitance elements within the match network 104.

Figure 3:
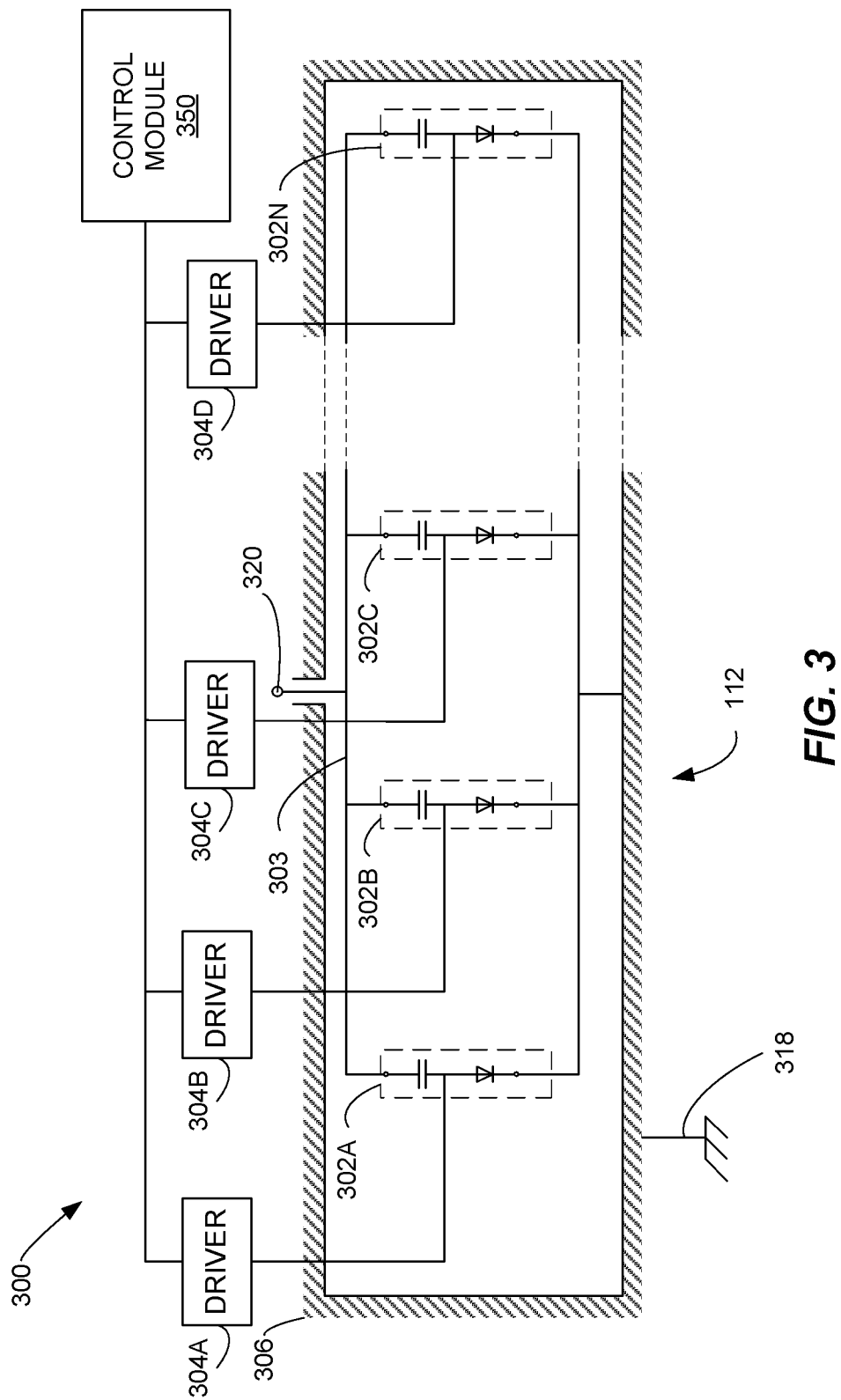
FIG. 3 is a schematic illustration of a variable capacitor bank of the match network of FIG. 2, the variable capacitor bank including multiple capacitor modules and respective driver circuits.

FIG. 3 is a schematic diagram 300 of the variable capacitance element 112, which is in the form of a variable capacitor bank. The variable capacitor bank 112 includes multiple capacitor modules 302A-302N that are arranged in parallel and that share a bus 303. Each of the capacitor modules 302A-302N is disposed within a grounded housing 306 such that each of the capacitor modules 302A-302N is shielded from external electromagnetic radiation. Each capacitor module 302A-302N is electrically coupled to a corresponding driver circuit 304A-304N.

Figure 4:
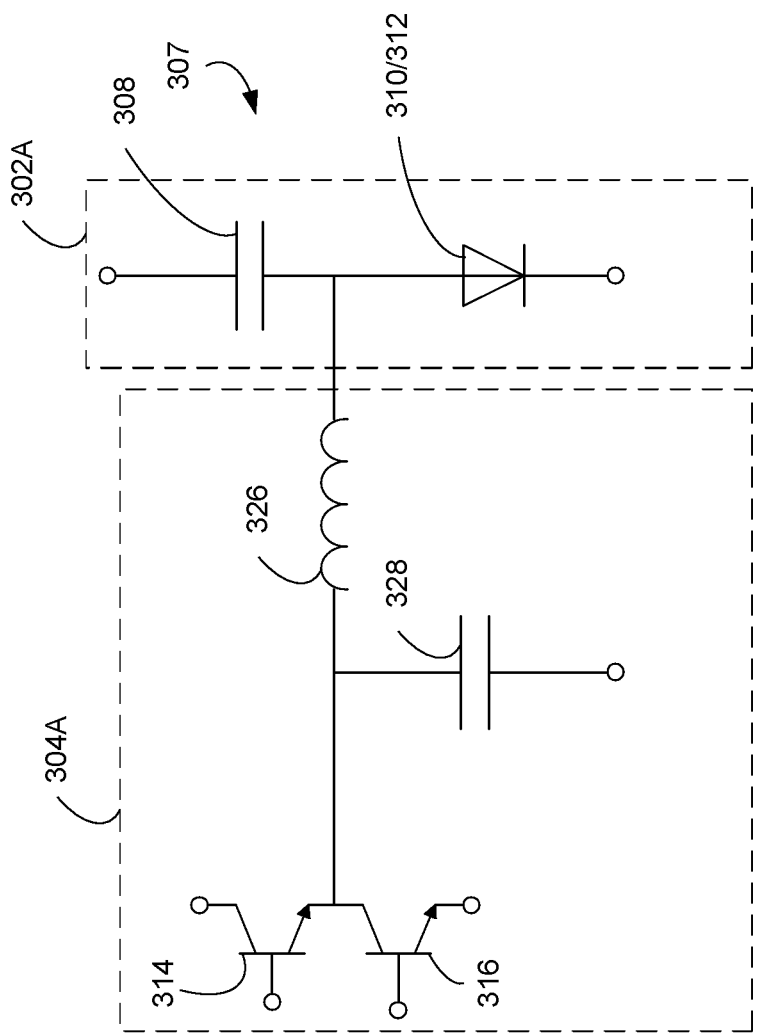
FIG. 4 is a circuit diagram of a capacitor module and driver circuit of the variable capacitor bank of FIG. 3.

FIG. 4 is a circuit diagram of the capacitor module 302A and corresponding driver circuit 304A and is representative of the other capacitor modules and respective driver circuits of FIG. 3. As illustrated in FIG. 4, the capacitor module 302A includes at least one switched capacitor branch 307 that includes a capacitor 308, which may be a solid state capacitor, and a switch element 310. In the illustrated implementation, the switch element 310 includes a PIN diode 312 that is controlled by the driver circuit 304A. In other implementations, an alternative type of switch may be used instead of the PIN diode 312. For example, and without limitation, field effect transistors (FETs) and electro-mechanical switches may be used instead of PIN diodes. The driver circuit 304A generally includes a pair of transistors 314, 316 that may be selectively activated to apply a forward and a reverse bias, respectively, to the PIN diode 312. In one implementation, the transistor 314 may be electrically coupled to a current source to forward bias the PIN diode 312 while the transistor 316 may be electrically coupled to a voltage source to reverse bias the PIN diode 312. When the PIN diode 312 is forward biased, current is permitted to flow through the capacitor branch 307 such that the capacitance of the capacitor 308 is added to the overall capacitance of the variable capacitor bank 112. Stated differently, when the PIN diode is on, the capacitor 308 is switched into the bank, thereby effecting the overall capacitance by being connected in parallel to whichever other capacitors of the bank are also switched in. Conversely, when the PIN diode 312 is reverse biased, current is sufficiently limited due to the high impedance presented by the "off-state" of the switch element 310 such that the capacitance of the capacitor 308 is effectively/sufficiently excluded from the overall capacitance of the variable capacitor bank 112. Although other sources may be used to impart the forward and the reverse bias on the PIN diode 312, in one specific implementation, the transistor 314 may be electrically coupled to a current source while the transistor 316 may be electrically coupled to a sufficient negative voltage source. In another implementation, a voltage source may be used to set the forward bias on the PIN diode 312 and ensure that the DC resistance of the circuit provides a current that is adequate to ensure consistent operation. Notably, the functionality of the PIN diode 312 will often become asymptotic beyond a certain current level, and, as a result, provides a measure of error tolerance.

As illustrated in FIG. 3, each of the driver circuits 304A-304N may be disposed outside of the housing 306 and may be electrically coupled to one of the capacitor module 302A-302N by a wire or cable extending through the housing 306. For example, in one implementation, the housing 206 may include small openings through which terminals of the driver circuits 304A-304N may be fed to allow connection between the driver circuits 304A-304N and their respective switches. Such openings are preferably minimized to reduce radiation of the RF signals into a compartment containing one or more of the driver circuits 304A-304N as such radiation may corrupt or otherwise interfere with the drive signal. For example, in certain implementations, the driver circuit's 304A-304N may be DC circuits and, as a result, may be susceptible to noise resulting from the RF current passed through their respective capacitor modules 302A-302N. Such noise may be attenuated in various ways including disposing the driver circuits 304A-304N outside of the housing 306 (and possibly in a separate, electrically grounded housing) and including a filter circuit to effectively block or otherwise significantly reduce RF current from travelling to the DC elements of the driver circuits 304A-304N. For example, as illustrated in FIG. 4, the driver circuit 304A includes each of an inductor 326 and a high capacitance shunt capacitor 328, which, in combination, substantially block RF current from reaching the transistors 314, 316.

Referring back to the variable capacitor bank 112 of FIG. 3, the capacitors within each of the capacitor modules 302A-302N may be selectively switched by their respective driver circuit 304A-304N to vary the total capacitance of the variable capacitor bank 112. For example, each of the driver circuits 304A-304N may be communicatively coupled to a control module 350 or similar computing device that selectively activates and deactivates the driver circuits 304A-304N to vary the total capacitance of the variable capacitor bank 112. In one implementation, the control module 350 may be communicatively coupled to one or more sensors or computing devices that measure reflected power such that the control module 350 may selectively control the driver circuits 304A-304N in response. In other implementations, other operational parameters may be used to selectively control the driver circuits 304A-304N including, without limitation, one or more of input impedance magnitude, input impedance phase shift, and incident power. In other implementations, the control module 350 may be configured to change the states of the driver circuits 304A-304N in response to a change in a mode of operation of a broader system. For example, the control module 350 may change the states of one of more of the driver circuits 304A-304N in response to an operator changing between two or more processes, each of which resulting in different load impedances.

As previously noted, each of the capacitor modules 302A-302N are disposed within a housing 306. The housing 306 substantially encapsulates the capacitor modules 302A-302N and provides electromagnetic shielding of the capacitor modules 302A-302N. As a result of such shielding, the potential electromagnetic interactions between the capacitor modules 302A-302N and other components of the match network 104 are minimized.

In certain implementations, the housing 306 is formed from a conductive material such as, but not limited to, aluminum or copper. The housing 306 is grounded, such as by being coupled to a chassis ground 318. In the implementation illustrated in FIG. 3, the housing 306 defines a single port 320 adapted to electrically couple the variable capacitor bank 112 to a broader match network circuit. In the single port configuration, each of the capacitor modules 302A-302N is electrically coupled to the housing 306 such that each of the capacitor modules 302A-302N is grounded through the housing 306.

The specific capacitance of the capacitor used in the capacitor modules of variable capacitors of the present disclosure may vary. For example, in the implementation illustrated in FIG. 3, some or all of the capacitor modules 302A-302N may include capacitors of different values. Similarly, in implementations in which capacitor modules include multiple capacitors (such as the capacitor module 500 of FIG. 5, discussed below), each capacitor within a given capacitor module may have the same or different values. Moreover, each capacitor module, as a whole, may have the same or different capacitance as other capacitor modules within a given variable capacitor bank. In other words, implementations of the present disclosure are not limited to any particular capacitance values for any of the individual capacitors used within a given capacitor module, the total capacitance provided by any capacitor module of the variable capacitor bank, or the total capacitance that may be provided by the variable capacitor bank.

In certain implementations, multiple capacitors or capacitor modules providing varying levels of capacitance may be included in a variable capacitor bank to provide increased resolution or control of the capacitance provided by the variable capacitor bank. For example, the variable capacitor bank may include capacitors having relatively high capacitance to facilitate large step-wise increases in the capacitance provided by the variable capacitor bank but may also include capacitors having lower capacitance that may be switched in or out to provide smaller incremental changes in the overall capacitance of the variable capacitor bank. As a result, the high and low capacitance elements may be selectively switched to provide a broad range of capacitance values while still enabling relatively small steps between successive capacitance values.

In addition to providing greater control over the capacitance provided by the variable capacitor bank, varying the value of individual capacitors or capacitor modules may be used to account for the capacitors and/or capacitor modules being distributed asymmetrically within the housing of the variable capacitor module. For example and particularly in high frequency applications, the impedance provided by a pair of otherwise identical switched capacitors may vary due to differences in the length of the conductive paths through each switched capacitor. Such variations may be accommodated for by varying the capacitance of the switched capacitors. Similarly, each switched capacitor may be subject to varying levels of stray inductance which may also be accommodated for by tailoring the capacitance of each capacitor.

FIG. 6 is an illustration of an example implementation of the capacitor module 302A represented in the circuit diagram of FIG. 4. The capacitor module 302A may, as illustrated, be implemented on a printed circuit board (PCB). In other implementations, each capacitor module 302A may instead be coupled to an alternative substrate. The capacitor module 302A includes an input 322 adapted to be coupled to the bus 303 of the variable capacitor bank 112. The capacitor module 302A further includes a pad 324 (or similar contact) to which the capacitor 308 is coupled. The capacitor 308 is, in turn, coupled to the PIN diode 312. As further illustrated and discussed in the context of FIGS. 8A-8B and 9, the capacitor module 302A is grounded by coupling the capacitor module 302A to the housing 306 of the variable capacitor bank using a conductive bracket or similar support.

Figure 5:
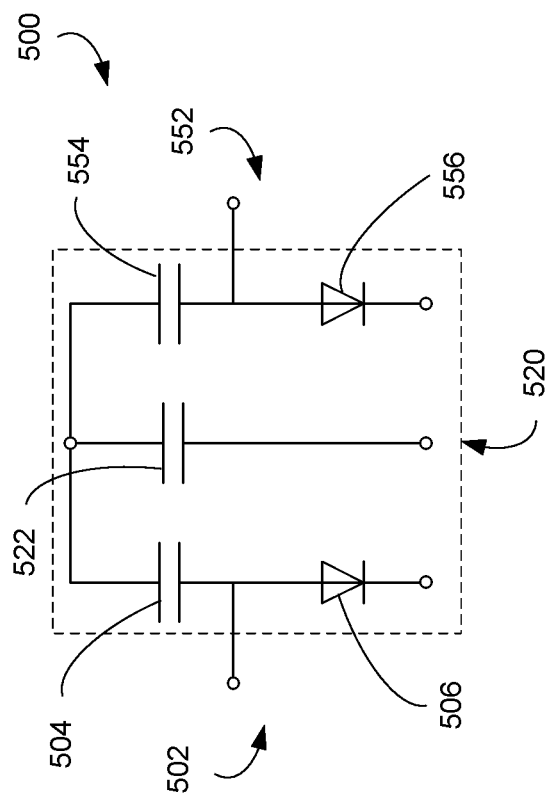
FIG. 5 is a circuit diagram of an alternative capacitor module including multiple switched capacitor branches and an unswitched capacitor branch.

The capacitor module 302A illustrated in FIG. 4 included a single switched capacitor branch 307; however, capacitor modules according to the present disclosure may include multiple capacitor branches, each of which may be switched or unswitched. For example, FIG. 5 is a schematic illustration of an alternative capacitor module 500 that includes multiple capacitor branches. More specifically, the capacitor module 500 includes a first switched capacitor branch 502 and a second switched capacitor branch 552 connected in parallel with the first switched capacitor branch 502. As illustrated, the first switched capacitor branch 502 includes a first capacitor 504 in series with a first PIN diode 506 (or similar switch element). Similarly, the second switched capacitor branch 552 includes a second capacitor 554 in series with a second PIN diode 556. Each of the first switched capacitor branch 502 and the second switched capacitor branch 552 may also be electrically coupled to a respective driver circuit, such as the driver circuit 304A illustrated in FIG. 4, to selectively control biasing of the PIN diodes 506, 556 and, as a result, current flow through the capacitor module 500.

The capacitor module 500 also includes a third capacitor branch 520 including a third capacitor 522. Notably, the third capacitor branch 520 is unswitched and, as a result, current always flows through the third capacitor branch 520 when current is supplied to the capacitor module 500. As a result, the third capacitor 522 functions as a "base" or "floor" capacitor of the capacitor module 500 that provides a minimum capacitance of the capacitor module 500 in combination with the "off-state" capacitance of the PIN diodes and any other "stray" capacitance and inductance either intentional or un-intentional within the circuit.

The capacitor module 500 is intended to illustrate another example of a capacitor module in accordance with the present disclosure that includes multiple capacitor branches. Other capacitor modules in accordance with this disclosure may include one or more switched capacitor branches and any suitable number of unswitched capacitor branches, including no unswitched capacitor branches.

FIG. 7 is an illustration of an example implementation of the capacitor module 500 represented in the circuit diagram of FIG. 5. The capacitor module 500 may, as illustrated, be implemented on a PCB. The capacitor module 500 includes an input 580 adapted to be coupled to a bus of a variable capacitor bank, such as the bus 303 of the variable capacitor bank 112. The capacitor module 500 further includes multiple pads 582-588 (or similar contacts) to which capacitors 504, 522, and 554 are electrically coupled. As illustrated, the pad 584 is further coupled to the PIN diode 506, thereby forming the first switched capacitor branch 502 and the pad 586 is further couple to the PIN diode 526, thereby forming the second switched capacitor branch 552. Similarly, the third capacitor 522 extends between the pad 582 and the pad 588, thereby forming the third, unswitched capacitor branch 520.

Figure 8A:
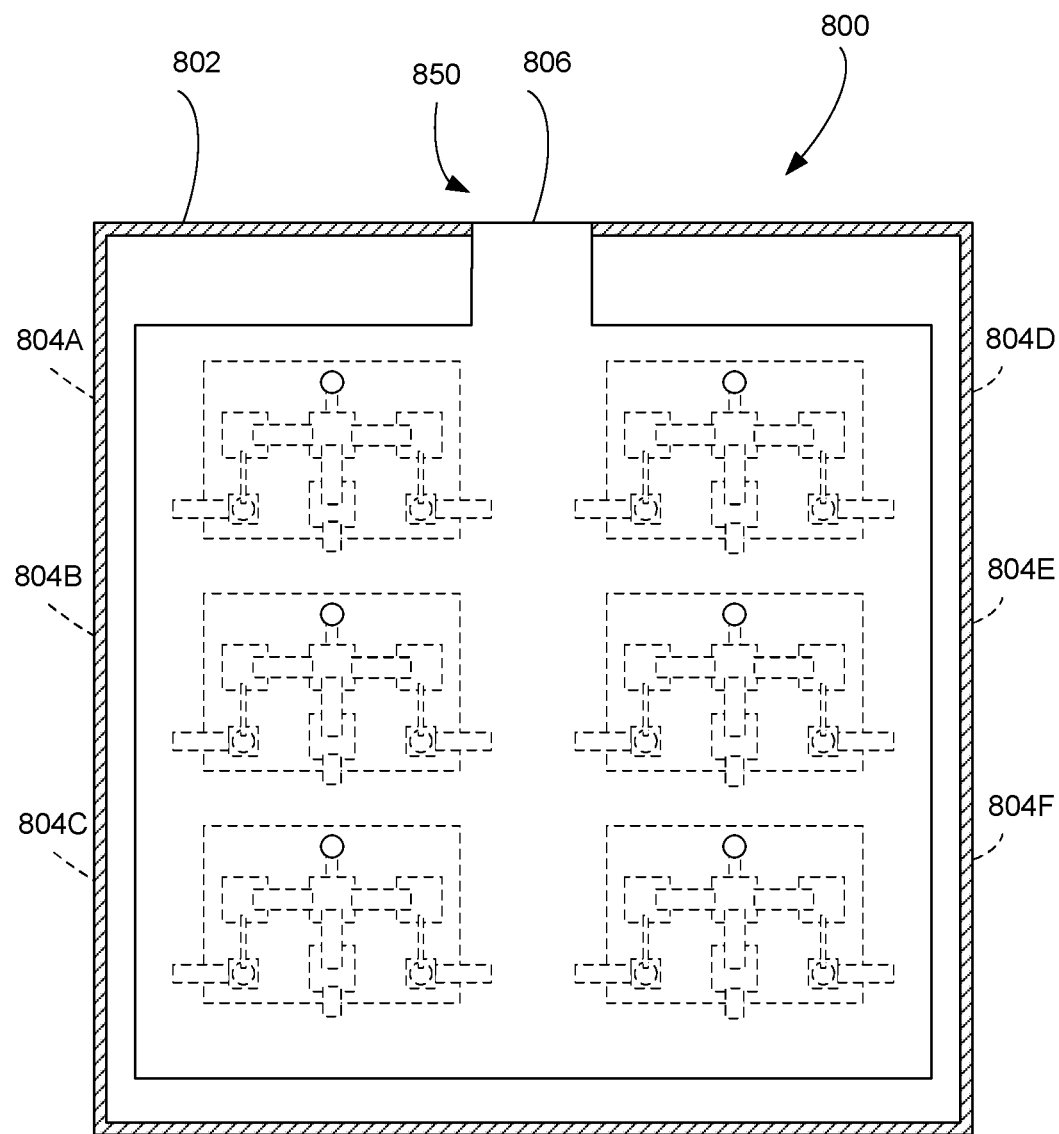
FIGS. 8A and 8B are cross-sectional views of a variable capacitor bank in accordance with the present disclosure having a substantially rectangular capacitor module arrangement.
Figure 8B:
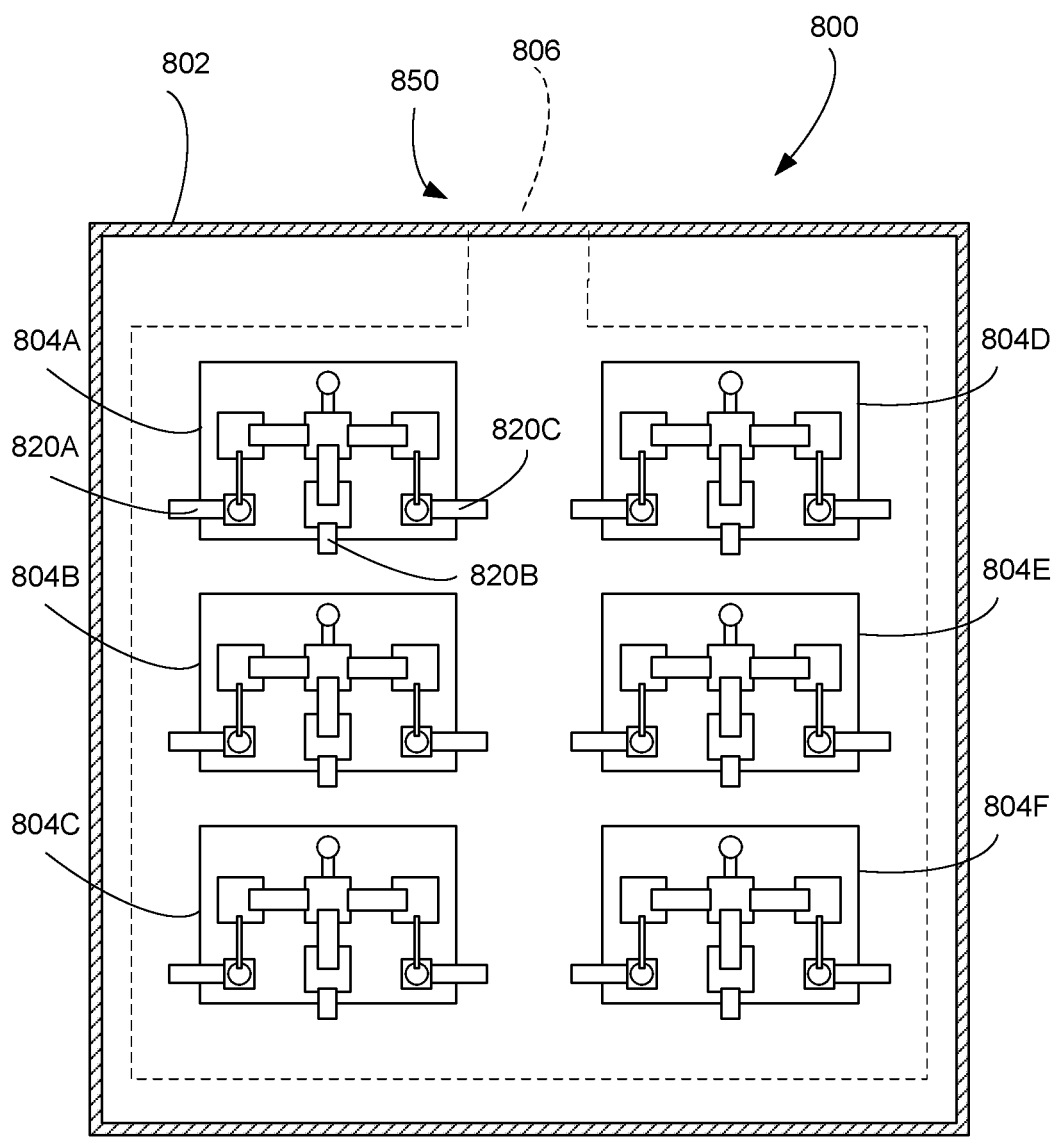

FIGS. 8A and 8B depict one implementation of a variable capacitor bank 112 according to the present disclosure. Specifically, each of FIGS. 8A and 8B are cross-sectional views of the capacitor bank 800 illustrating the arrangement of internal components of the variable capacitor bank 800. As shown, the variable capacitor bank 800 includes a housing 802 within which multiple capacitor modules 804A-804F are disposed. The housing 802 further includes a bus 806. As illustrated in FIG. 8A, the bus 806 may be in the form of a plate that extends throughout the housing 802. For example, the bus 806 may extend within the housing 802 such that the bus 806 extends over each of the capacitor modules 804A-804F. Although illustrated as a substantially rectangular planar conductive structure, the bus 806 may take on other shapes to accommodate alternative arrangements of the capacitor modules 804A-804F. FIG. 8B illustrates the bus 806 in dashed lines to provide further details of the underlying capacitor modules 804A-804F.

Figure 8C:
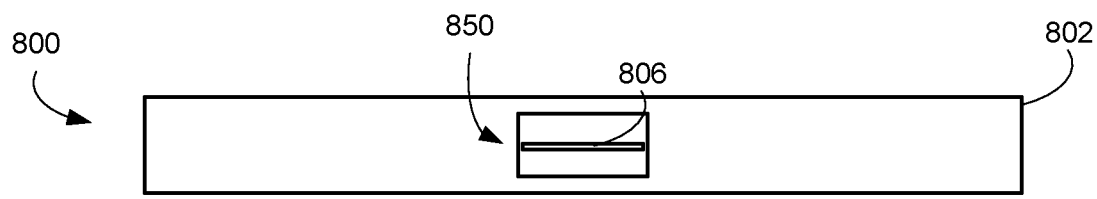
FIG. 8C is a side elevation view of the variable capacitor bank of FIGS. 8A and 8B.

Referring first to FIG. 8A, the bus 806 is illustrated as a plate 806 that extends throughout the interior of the housing 802. As shown, the bus 806 may, at least in part, extend to or outside of the housing 802. Accordingly, the portion of the bus 806 extending from the housing 802 and the housing 802 itself may together define a single port 850 to facilitate electrical coupling of the bus 806 with other elements of a match circuit, such as the match circuit 104 of FIGS. 1 and 2. For example, FIG. 8C is a side elevation view of the variable capacitor bank 800 illustrating the port 850. As shown, the port 850 is formed by the bus 806 extending through the housing 802 and defining a conductive interface to which a connector, cable, or other electrical coupling may be attached. In such implementations, the electrical coupling may include a first contact for connecting a first conductor carrying an RF signal to the bus 806 and a second contact for connecting a second conductor to the housing 802 (ground).

Referring now to FIG. 8B, each of the capacitor modules 804A-804F are illustrated as being substantially similar to the capacitor module 500 of FIG. 5, which includes a pair of switched capacitor branches and an unswitched "floor" capacitor branch in parallel. Each of the capacitor modules 804A-804F are electrically coupled to each of the bus 806 and the housing 802 such that current flows from the bus 806 to ground via the housing 802.

Figure 9:
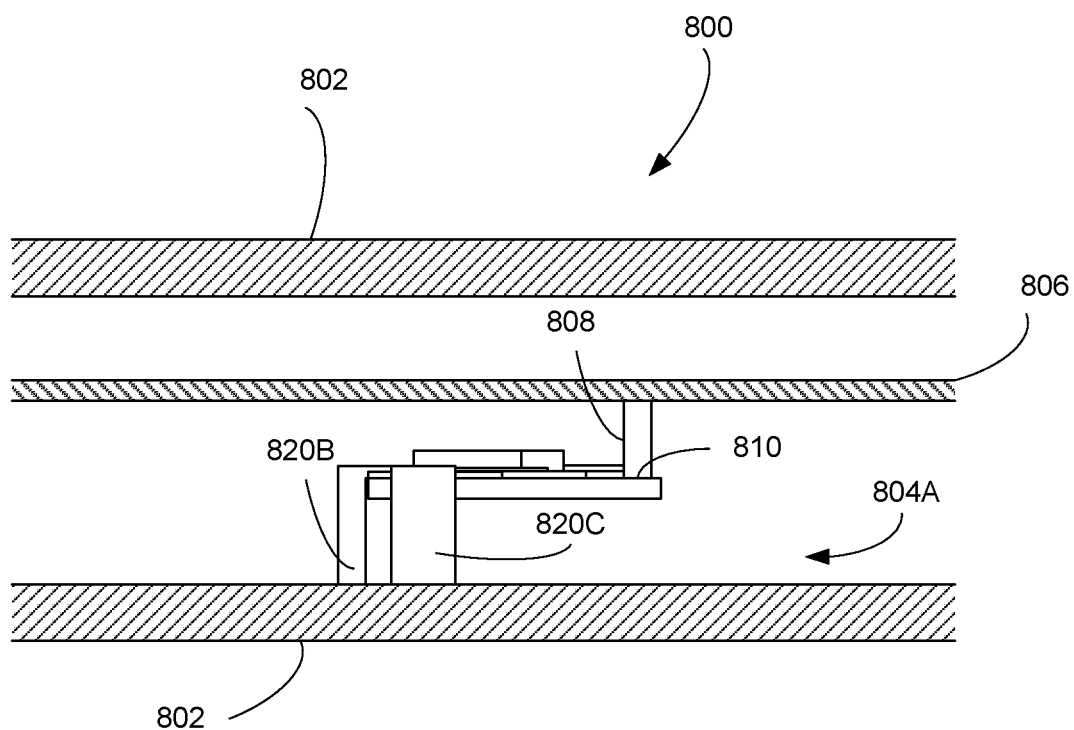
FIG. 9 is a cross-sectional side view of a capacitor module of the variable capacitor bank of FIGS. 8A and 8B illustrating one possible mounting arrangement of the capacitor module.

One method of coupling the capacitor modules to the bus 806 and the housing 802 is illustrated in FIG. 9, which is a cross-sectional view of the variable capacitor bank 800 and, in particular, a cross-sectional view illustrating the coupling of capacitor module 804A. As shown, the capacitor module 804A is suspended between the bus 806 and the housing 802 by various conductive structural elements. In particular, a conductive post 808 or fastener may extend from the bus 806 to an input 810 of the capacitor module 804A, thereby physically and electrically coupling the capacitor module 804A to the bus 806.

To ground the capacitor module 804A, one or more conductive brackets or supports may be used to couple the capacitor module 804A to the housing 802. For example, as illustrated in both FIG. 8B and FIG. 9, each branch of the capacitor module 804A may be coupled to the housing 802 by a respective conductive bracket 820A-820O and/or fastener. Similar to the post 808, the brackets 820A-820O provide both electrical and physical coupling between the capacitor module 804A and the housing 802. Notably, any two or more branches of a capacitor module in accordance with the present disclosure may also share a given conductive bracket or fastener for coupling the branches to the housing 802.

Grounding elements may add inductance and such inductance may create a voltage offset from ground that may affect the ability to accurately characterize the capacitor modules 804A-804F. Accordingly, in implementations of the present disclosure, the conductive brackets 820A-820O and, more generally, any path to ground of the variable capacitor bank 800 through the capacitor modules 804A-804F to ground, may be minimized. By minimizing distance to ground for each capacitor module 804A-804F, the effects of any voltage offsets resulting from inductance of the path to ground may be reduced and/or rendered negligible.

Figure 10:
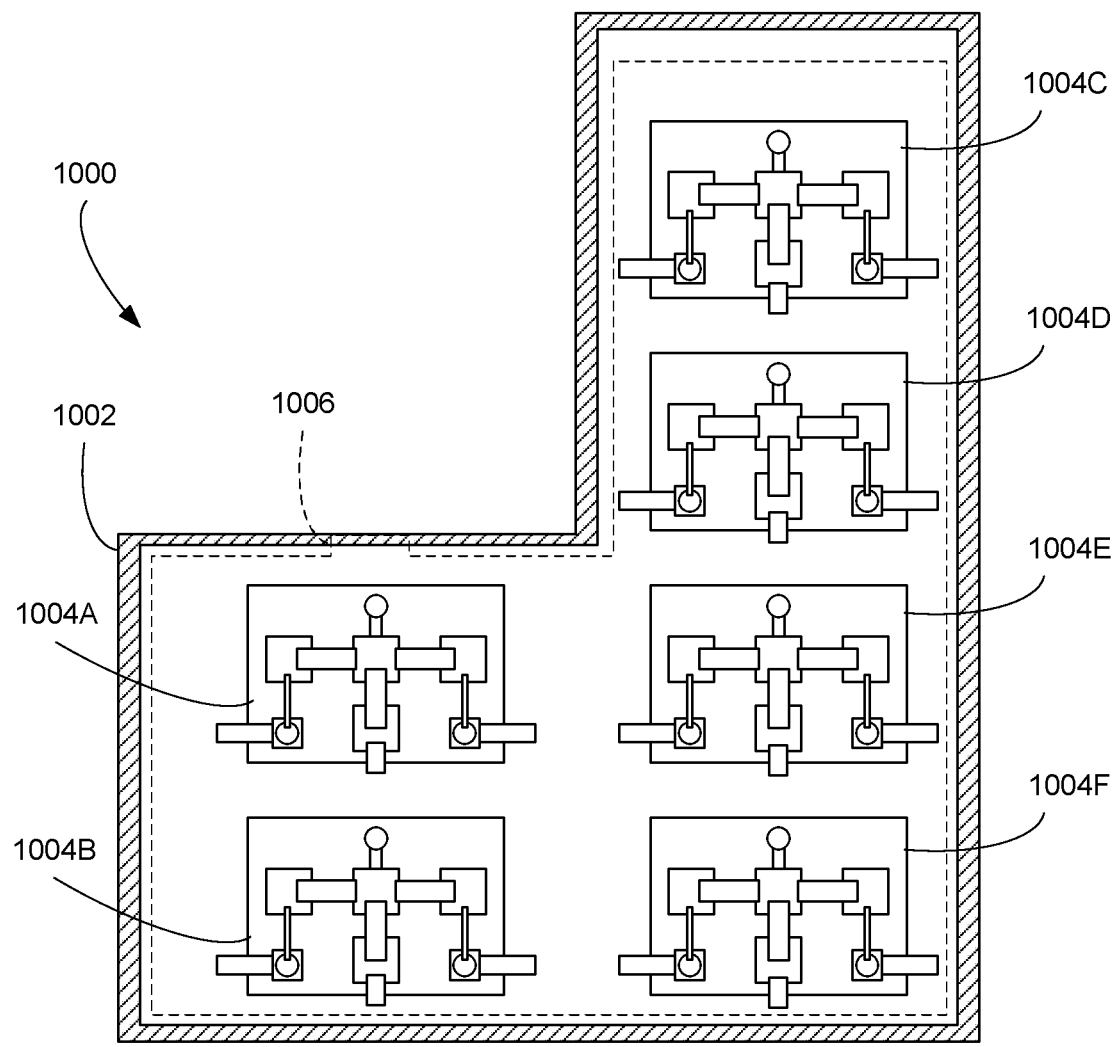
FIG. 10 is a cross-sectional view of an alternative variable capacitor bank in accordance with the present disclosure having an asymmetric capacitor module arrangement.

FIG. 10 is a cross-sectional view of an alternative variable capacitor bank 1000 according to the present disclosure. Similar to the variable capacitor bank 800 of FIGS. 8A and 8B, the variable capacitor bank 1000 includes a housing 1002 within which multiple capacitor modules 1004A-1004F are disposed. The housing 1002 further includes a bus 1006 (shown in dashed lines for clarity). As illustrated in FIG. 10, the capacitor modules 1004A-1004F are asymmetrically distributed within the housing 1002. Specifically, the capacitor modules 1004A and 1004B are arranged in a first column while the capacitor modules 1004C-1004F are arranged in a second column.

The two column, asymmetrical arrangement of capacitor modules in FIG. 10 and the rectangular arrangement of capacitor modules of FIGS. 8A and 8B are intended merely as examples of potential capacitor module distributions in variable capacitor banks according to the present disclosure. In other implementations, the quantity and location of capacitor modules may be varied. For example, in applications in which more discrete impedance control is required, the variable capacitor bank may include a greater quantity of capacitor modules and/or each capacitor module may include a greater quantity of switched capacitor branches. Conversely, in applications in which the range of capacitance may be relatively limited, a variable capacitor bank may include fewer capacitor modules, each of which may include only a single switched capacitor.

As noted, the specific arrangement of capacitor modules within the housing of the variable capacitor bank may also be varied. In certain cases, the overall shape of the housing and, as a result, the distribution of capacitor modules within the housing may be dictated by available space within a chassis, module, or similar enclosure. In such cases, the housing may include various cutouts or be otherwise shaped to fit within the enclosure and around any adjacent equipment.

The distribution of the capacitor modules within the housing may also be dictated by the frequencies of the RF signals to be provided to the variable capacitor bank. For example, at relatively high frequencies, differences in the distances between the port of the variable capacitor bank and each of the capacitor modules can cause non-negligible variations in the impedance provided by switching the capacitor modules even when the capacitor modules themselves are substantially the same (i.e., they contain capacitors having substantially the same capacitance). As a result of such variations, the resolution of the variable capacitor bank may be inconsistent over its full range because each capacitor module may provide a slightly different change in capacitance as its state is changed. This effect is primarily due to the inductance provided by the conductive path defined between the port of the variable capacitor bank and each of the switched capacitors/capacitor modules. Such inductance causes the apparent capacitance of the switched capacitor/capacitor module to vary from its actual rated capacitance. This variance is particularly significant if either a high frequency signal is used or the capacitance values of the switched capacitors are particularly large.

An approach to resolving the foregoing issue is to select the capacitors of the capacitor modules to account for any such variations. However, such an approach may be complex and may require the use of custom or otherwise non-standard capacitors. An alternative approach is to design the variable capacitor bank such that each of the capacitor modules is substantially equidistant from the port of the variable capacitor bank. For purposes of this disclosure, substantially equidistant is intended to mean as equal as possible given variations that may result from manufacturing tolerances, structural limitations (e.g., traces having to be routed around physical structures of the capacitor module), and other similar factors. By arranging the modules to be substantially equidistant, the conductive path extending from the port of the variable capacitor bank through each respective capacitor module is substantially the same and, as a result, provides substantially the same inductance. As a result, the effect of the inductance associated with the conductor coupling each capacitor module to the bus may be known, uniform, and readily accounted for when operating the variable capacitor bank.

Figure 11:
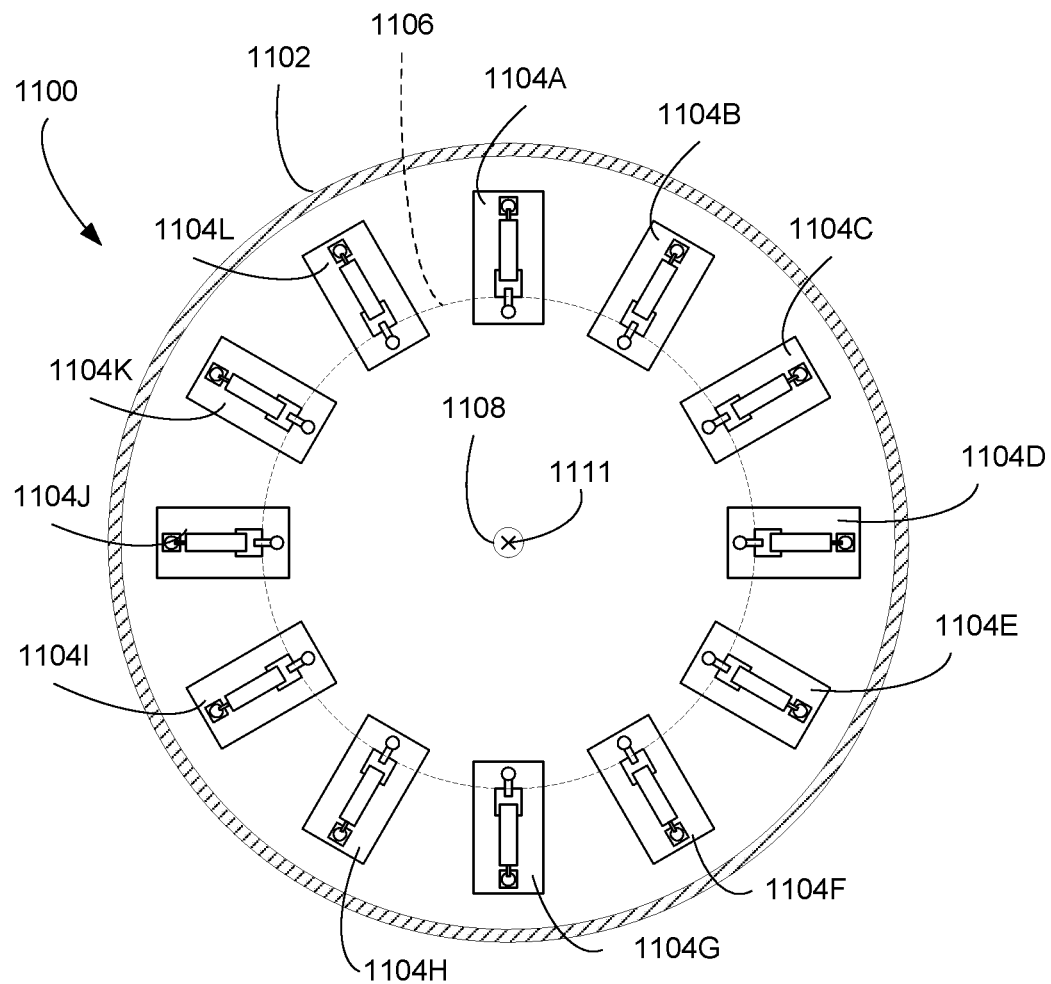
FIG. 11 is a cross-sectional view of an alternative variable capacitor bank in accordance with the present disclosure having a circular capacitor module arrangement.

One such implementation is illustrated in FIG. 11, which is a cross-sectional view of another variable capacitor bank 1100 according to the present disclosure. The variable capacitor bank 1100 includes a housing 1102 within which capacitor modules 1104A-1104L and a bus 1106 are disposed. Each of the capacitor modules 1104A-1104L is electrically coupled to each of the bus 1106 and the housing 1102. The capacitor bank 1100 further includes a port 1108 electrically coupled to the bus 1106 and adapted for coupling the variable capacitor bank 1100 to other elements of a match or other circuit.

As illustrated in FIG. 11, each of the housing 1102 and the bus 1106 are circular in shape and concentric with respect to each other such that they are disposed along a shared axis 1111. The port 1108 is similarly disposed along the shared axis 1111. The capacitor modules 1104A-1104L are arranged in a circular array about the port 1108 such that each of the capacitor modules 1104A-1104L are disposed substantially equidistant from the port 1108. By doing so the inductance resulting from the conductive paths between the port 1108 and each of the respective capacitor modules 1104A-1104L is substantially equal for each capacitor module 1104A-1104L and can be readily accounted for when characterizing the variable capacitor bank 1100. Nevertheless, the inductance and its resulting effect on the apparent capacitance of each capacitor module 1104A-1104L is preferably minimized across the full operating range of the variable capacitor bank 1100. For example, in certain implementations, each of the capacitor modules 1104A-1104L is disposed relative to the port 1108 such that the resulting inductance does not result in a variation of greater than 5% between the actual capacitance of the individual capacitor modules 1104A-1104L and the apparent capacitance during operation.

Although the present disclosure has focused primarily on single-port configurations, variable capacitor banks of the present disclosure may also be configured in multi-port configurations as well. As opposed to the single-port configurations, which are generally implemented as parallel shunts, the multi-port configurations may allow, among other things, for the variable capacitor bank to be connected in series with one or more other electrical components.

Figure 12:
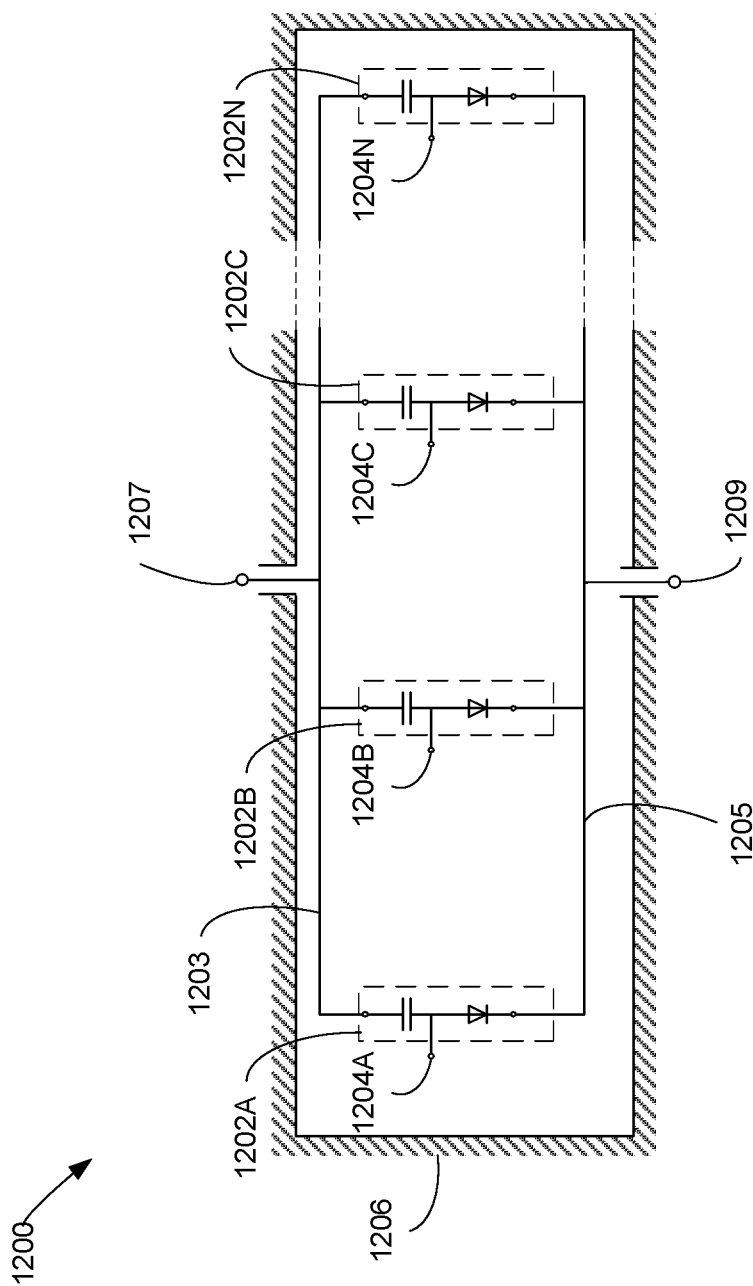
FIG. 12 is a schematic illustration of a two-port variable capacitor bank in accordance with the present disclosure.

FIG. 12 is a schematic illustration 1200 of a two-port variable capacitor bank 1200 in accordance with the present disclosure. The variable capacitor bank 1200 includes multiple capacitor modules 1202A-1202N that are arranged in parallel and that share each of a first bus 1203 and a second bus 1205. Each of the capacitor modules 1202A-1202N is disposed within a grounded housing 1206 such that each of the capacitor modules 1202A-1202N is shielded from external electromagnetic radiation. The first bus 1203 is coupled to an input port 1207 while the second bus 1205 is coupled to an output port 1209, each of which may be similar to the port 850 illustrated in FIG. 8C.

Each capacitor module 1202A-1202N is electrically coupled to a corresponding driver circuit to control operation of the capacitor module 1202A-1202N. For example, each capacitor module 1202A-1202N may include a connection 1204A-1204N for coupling to a driver circuit. As discussed in the context of FIGS. 3 and 4, each driver circuit may be disposed outside of the housing 1206 and may be coupled to a respective one of the capacitor modules 1202A-1202N with a filter circuit to minimize interference on the driver circuit by the other components of the variable capacitor bank 1200. Each of the driver circuits may be communicatively coupled to a control module or similar computing device, such as the control module 350 of FIG. 3, to selectively control each of the capacitor modules 1202A-1202N.

When implemented in a two-port configuration, such as illustrated in FIG. 12, the variable capacitor bank 1200 may be coupled in series with other components of the matching network. For example, the input port 1207 of the variable capacitor 1200 may be coupled to a bus or first component of a matching network while the output port 1209 could be electrically coupled to a second element in the match network (e.g., an adjacent capacitor or inductor). In such an arrangement, the variable capacitor 1200 would be connected in series with the adjacent components as compared to the shunt arrangements illustrated in previous implementations discussed in this disclosure.

The description above includes example systems, methods, techniques, instruction sequences, and/or computer program products that embody techniques of the present disclosure. However, it is understood that the described disclosure may be practiced without these specific details.

In the present disclosure, the methods disclosed may be implemented as sets of instructions or software readable by a device. Further, it is understood that the specific order or hierarchy of steps in the methods disclosed are instances of example approaches. Based upon design preferences, it is understood that the specific order or hierarchy of steps in the method can be rearranged while remaining within the disclosed subject matter. The accompanying method claims present elements of the various steps in a sample order, and are not necessarily meant to be limited to the specific order or hierarchy presented.

The described disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form (e.g., software, processing application) readable by a machine (e.g., a computer). The machine-readable medium may include, but is not limited to, magnetic storage medium (e.g., hard disk drive), optical storage medium (e.g., CD-ROM); magneto-optical storage medium, read only memory (ROM); random access memory (RAM); erasable programmable memory (e.g., EPROM and EEPROM); flash memory; or other types of medium suitable for storing electronic instructions.

Figure 13:
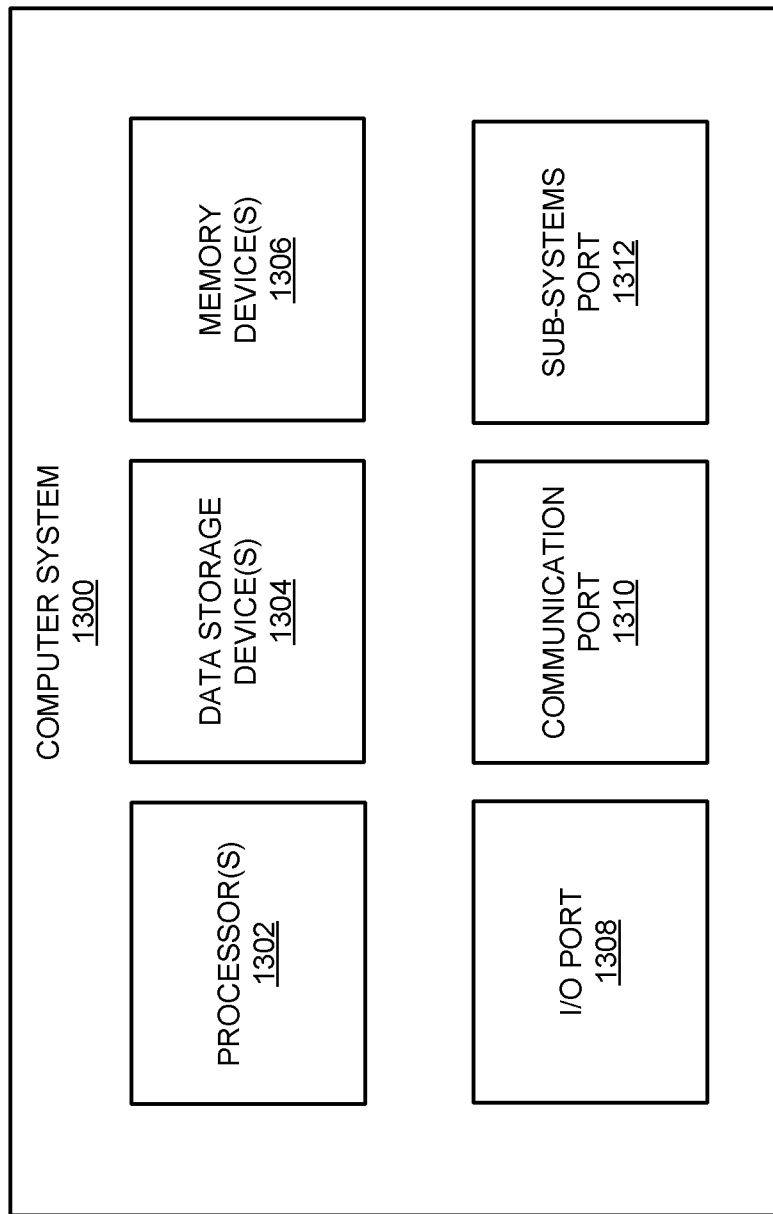
FIG. 13 is a block diagram of a computer system which may be used, among other things, to selectively control variable capacitor banks of the present disclosure.

For example, FIG. 13 is a block diagram illustrating an example of a host or computer system 1300 which may be used in implementing the embodiments of the present disclosure, such as the control module 350 shown in FIG. 3. The computer system (system) includes one or more processors 1302-1306. Processors 1302-1306 may include one or more internal levels of cache (not shown) and a bus controller or bus interface unit to direct interaction with the processor bus 1312. Processor bus 1312, also known as the host bus or the front side bus, may be used to couple the processors 1302-1306 with the system interface 1314. System interface 1314 may be connected to the processor bus 1312 to interface other components of the system 1300 with the processor bus 1312. For example, system interface 1314 may include a memory controller 1313 for interfacing a main memory 1316 with the processor bus 1312. The main memory 1316 typically includes one or more memory cards and a control circuit (not shown). System interface 1314 may also include an input/output (I/O) interface 1320 to interface one or more I/O bridges or I/O devices with the processor bus 1312. One or more I/O controllers and/or I/O devices may be connected with the I/O bus 1326, such as I/O controller 1328 and I/O device 1330, as illustrated.

I/O device 1330 may also include an input device (not shown), such as an alphanumeric input device, including alphanumeric and other keys for communicating information and/or command selections to the processors 1302-1306. Another type of user input device includes cursor control, such as a mouse, a trackball, or cursor direction keys for communicating direction information and command selections to the processors 1302-1306 and for controlling cursor movement on the display device.

System 1300 may include a dynamic storage device, referred to as main memory 1316, or a random access memory (RAM) or other computer-readable devices coupled to the processor bus 1312 for storing information and instructions to be executed by the processors 1302-1306. Main memory 1316 also may be used for storing temporary variables or other intermediate information during execution of instructions by the processors 1302-1306. System 1300 may include a read only memory (ROM) and/or other static storage device coupled to the processor bus 1312 for storing static information and instructions for the processors 1302-1306. The system set forth in FIG. 13 is but one possible example of a computer system that may employ or be configured in accordance with aspects of the present disclosure.

According to one embodiment, the above techniques may be performed by computer system 1300 in response to processor 1304 executing one or more sequences of one or more instructions contained in main memory 1316. These instructions may be read into main memory 1316 from another machine-readable medium, such as a storage device. Execution of the sequences of instructions contained in main memory 1316 may cause processors 1302-1306 to perform the process steps described herein. In alternative embodiments, circuitry may be used in place of or in combination with the software instructions. Thus, embodiments of the present disclosure may include both hardware and software components.

A computer readable medium includes any mechanism for storing or transmitting information in a form (e.g., software, processing application) readable by a machine (e.g., a computer). Such media may take the form of, but is not limited to, non-volatile media and volatile media. Non-volatile media includes optical or magnetic disks. Volatile media includes dynamic memory, such as main memory 1316. Common forms of machine-readable medium may include, but is not limited to, magnetic storage medium (e.g., hard disk drive); optical storage medium (e.g., CD-ROM); magneto-optical storage medium; read only memory (ROM); random access memory (RAM); erasable programmable memory (e.g., EPROM and EEPROM); flash memory; or other types of medium suitable for storing electronic instructions.

Embodiments of the present disclosure include various operations or steps, which are described in this specification. The steps may be performed by hardware components or may be embodied in machine-executable instructions, which may be used to cause a general-purpose or special-purpose processor programmed with the instructions to perform the steps. Alternatively, the steps may be performed by a combination of hardware, software and/or firmware.

It is believed that the present disclosure and many of its attendant advantages will be understood by the foregoing description, and it will be apparent that various changes may be made in the form, construction, and arrangement of the components without departing from the disclosed subject matter or without sacrificing all of its material advantages. The form described is merely explanatory, and it is the intention of the following claims to encompass and include such changes.

While the present disclosure has been described with reference to various embodiments, it will be understood that these embodiments are illustrative and that the scope of the disclosure is not limited to them. Many variations, modifications, additions, and improvements are possible. More generally, embodiments in accordance with the present disclosure have been described in the context of particular implementations. Functionality may be separated or combined in blocks differently in various embodiments of the disclosure or described with different terminology. These and other variations, modifications, additions, and improvements may fall within the scope of the disclosure as defined in the claims that follow.

What is claimed is:

1. A variable capacitor bank comprising:
   a conductive housing;
   an electrical bus comprising a first portion disposed within the conductive housing and a second portion extending through the conductive housing such that the second portion of the electrical bus and the conductive housing form a port, wherein the first portion of the electrical bus is electrically coupled to the conductive housing; and
   a switched capacitor disposed within the conductive housing, the switched capacitor electrically coupled to the first portion of the electrical bus, wherein the switched capacitor comprises a switch coupled to a driver circuit.

2. The variable capacitor bank of claim 1, wherein the driver circuit is disposed outside the conductive housing and is coupled to the switched capacitor by a conductor extending through the conductive housing.

3. The variable capacitor bank of claim 1, further comprising a plurality of capacitor modules disposed within the conductive housing, wherein a first capacitor module of the plurality of capacitor modules comprises the switched capacitor.

4. The variable capacitor bank of claim 3, wherein the plurality of capacitor modules are disposed in an asymmetrical array.

5. The variable capacitor bank of claim 3, wherein each of the plurality of capacitor modules is coupled to the electrical bus by a respective conductive path, each conductive path being substantially equal in length.

6. The variable capacitor bank of claim 3, wherein the port is disposed along a common axis of the electrical bus and the conductive housing, and the plurality of capacitor modules are disposed in a circular array about the port.

7. The variable capacitor bank of claim 6, wherein each of the plurality of capacitor modules is coupled to the electrical bus by a respective conductive path, each conductive path being substantially equal in length.

8. The variable capacitor bank of claim 1, wherein the electrical bus is a first electrical bus, the variable capacitor bank further comprising a second electrical bus, wherein the second electrical bus and the conductive housing define a second port.

9. The variable capacitor bank of claim 8, wherein the switched capacitor is one of a plurality of switched capacitors comprised in one of a plurality of capacitor modules, wherein the capacitor modules are arranged in parallel and share the first electrical bus and the second electrical bus.

10. A variable capacitor bank comprising:
    a conductive housing;
    a port extending through the conductive housing; and
    a plurality of switched capacitors disposed within the conductive housing and electrically coupled to the conductive housing and the port, wherein each switched capacitor is coupled to the port by a respective conductive path, wherein each conductive path is substantially equal in length.

11. The variable capacitor bank of claim 10, wherein the plurality of switched capacitors are disposed in a circular array about the port.

12. The variable capacitor bank of claim 11, further comprising a bus, wherein the bus and the conductive housing are circular and concentric with the circular array of the switched capacitors.

13. The variable capacitor bank of claim 10, further comprising a plurality of capacitor modules disposed within the conductive housing, wherein a first capacitor module of the plurality of capacitor modules comprises the plurality of switched capacitors.

14. The variable capacitor bank of claim 13, wherein the plurality of switched capacitors is a first plurality of switched capacitors, wherein a second capacitor module of the plurality of capacitor modules comprises a second plurality of switched capacitors.

15. The variable capacitor bank of claim 13, further comprising a first bus and a second bus, wherein the capacitor modules share the first bus and the second bus.

16. The variable capacitor bank of claim 15, wherein the port is an input port, the variable capacitor bank further comprising an output port, wherein the first bus is coupled to the input port, and the second bus is coupled to the output port.

17. A variable capacitor bank comprising:
- a conductive housing;
- an electrical bus comprising a first portion disposed within the conductive housing and a second portion extending through the conductive housing such that the second portion of the electrical bus and the conductive housing form a port, wherein the first portion of the electrical bus is electrically coupled to the conductive housing; and
- a switched capacitor disposed within the conductive housing, the switched capacitor electrically coupled to the first portion of the electrical bus, wherein the switched capacitor comprises a diode.

18. The variable capacitor bank of claim 17, further comprising a plurality of capacitor modules disposed within the conductive housing, wherein a first capacitor module of the plurality of capacitor modules comprises the switched capacitor.

19. The variable capacitor bank of claim 18, wherein each of the plurality of capacitor modules is coupled to the electrical bus by a respective conductive path, each conductive path being substantially equal in length.

20. The variable capacitor bank of claim 18, wherein the port is disposed along a common axis of the electrical bus and the conductive housing, and the plurality of capacitor modules are disposed in a circular array about the port.

* * * * *